(12) United States Patent
Feigelson et al.

(10) Patent No.: US 8,449,672 B2
(45) Date of Patent: May 28, 2013

(54) METHOD OF GROWING GROUP III NITRIDE CRYSTALS

(75) Inventors: Boris N. Feigelson, Springfield, VA (US); Richard L. Henry, Great Falls,, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 1114 days.

(21) Appl. No.: 12/149,051

(22) Filed: Apr. 25, 2008

(65) Prior Publication Data

US 2008/0229549 A1 Sep. 25, 2008

Related U.S. Application Data

(63) Continuation-in-part of application No. 11/217,854, filed on Sep. 1, 2005, now abandoned.

(60) Provisional application No. 60/610,866, filed on Sep. 3, 2004.

(51) Int. Cl.
*C03B 11/04* (2006.01)

(52) U.S. Cl.
USPC ............... 117/11; 117/68; 117/71; 117/73; 117/74; 117/77; 117/81; 117/82; 117/83; 252/518.1; 252/521.6; 252/584; 257/615; 257/E33.025; 257/E33.028; 257/E33.03; 257/E33.033

(58) Field of Classification Search
USPC ......... 117/68, 71, 73, 74, 77, 955, 11, 81–83, 117/952; 252/518.1, 521.6, 584; 257/615, 257/E33.025, E33.028, E33.03, E33.033
See application file for complete search history.

(56) References Cited

U.S. PATENT DOCUMENTS

| | | | | |
|---|---|---|---|---|
| 6,596,079 B1 * | 7/2003 | Vaudo et al. | .................. | 117/97 |
| 2003/0183155 A1 * | 10/2003 | D'Evelyn et al. | .............. | 117/68 |
| 2004/0003495 A1 * | 1/2004 | Xu | .................................. | 29/832 |
| 2009/0223440 A1 * | 9/2009 | Feigelson et al. | .............. | 117/56 |

* cited by examiner

*Primary Examiner* — Michael Kornakov
*Assistant Examiner* — Kenneth A Bratland, Jr.
(74) *Attorney, Agent, or Firm* — Amy L. Ressing; Stephen T. Hunnius

(57) ABSTRACT

This disclosure pertains to a process for making single crystal Group III nitride, particularly gallium nitride, at low pressure and temperature, in the region of the phase diagram of Group III nitride where Group III nitride is thermodynamically stable comprises a charge in the reaction vessel of (a) Group III nitride material as a source, (b) a barrier of solvent interposed between said source of Group III nitride and the deposition site, the solvent being prepared from the lithium nitride ($Li_3N$) combined with barium fluoride ($BaF_2$), or lithium nitride combined with barium fluoride and lithium fluoride (LiF) composition, heating the solvent to render it molten, dissolution of the source of GaN material in the molten solvent and following precipitation of GaN single crystals either self seeded or on the seed, maintaining conditions and then precipitating out.

8 Claims, 6 Drawing Sheets

FIG. 4.A

METHOD OF GROWING GROUP III NITRIDE CRYSTALS

CROSS-REFERENCE TO RELATED APPLICATION

This patent application claims priority to and the benefit of U.S. Provisional Patent Application No. 60/610,866, filed Sep. 3, 2004, and is continuation-in-part and claims priority to and the benefits of U.S. patent application Ser. No. 11/217,854, filed Sep. 1, 2005, both of which are herein incorporated by reference in the entirety.

This invention is characterized by low temperature and low pressure growth from solution of single crystal Group III of the Periodic Table nitride, namely boron nitride (BN), aluminum nitride (AlN), gallium nitride (GaN), and indium nitride (InN), with a temperature gradient.

Semiconductor light emitting devices using gallium nitride (GaN) and other Group III nitrides semiconductors are theoretically capable of emitting light over a wide range from visible spectrum to the ultraviolet. Because of such characteristics, the Group III nitride semiconductors, particularly gallium nitride, have been placed under active development during the last 15 years or so. Group III nitride semiconductors also have a large possibility as a material of high electron mobility devices and have been expected to be used as material of high frequency and high-power semiconductor devices.

For manufacturing light emitting or electronic devices using such Group III nitride semiconductors, it is necessary to grow the nitride semiconductor by chemical vapor deposition or molecular beam epitaxy. The best substrate for these processes should be single crystal Group III nitride. If a wide bandgap Group III nitride single crystal, particularly gallium nitride, substrate were obtained, the problem of the mismatches of the lattice constant and the thermal expansion between the substrate and epitaxial active layer would be entirely solved.

One of the techniques presently used for commercial production of gallium nitride substrates is hydride vapor-phase epitaxy, which has been used to grow wafers up to about 2 inches in diameter at growth rates of over 100 μm/hr. The dislocation density of the best of such samples is approximately $10^6/cm^2$. Another known technique for single-crystal growth involves deposition of gallium nitride from a liquid phase. Growth from the liquid phase has resulted in gallium nitride single crystals with dislocation densities of less than $10^2/cm^2$.

The liquid phase techniques are done using high pressures and high temperatures. High nitrogen pressure counters the gallium nitride decomposition that occurs at the high temperatures of above 1500° C. required to dissolve nitrogen in gallium. These high-pressure/high-temperature techniques have been used to grow gallium nitride crystal platelets of up to 1.5 cm in lateral size. Since the crystal growth here requires pressures on the order of 10 kbar or more and the rates of crystal growth are low, the routine growth of 2 inches in diameter wafers on a production scale is a daunting challenge.

Gallium nitride has also been grown at lower temperatures/pressures by a sodium flux method and by a lithium flux method. Both flux methods use elemental gallium, gaseous nitrogen and either elemental alkali metal or alkali metal nitrides to increase reactivity and solubility of nitrogen in gallium. In the sodium flux and the lithium flux methods, the gaseous nitrogen reacts with the flux/elemental gallium to saturate the solution and deposit crystals. For both of these flux technologies, it has been difficult to establish and control seeded growth of large gallium nitride crystals because the composition of the melt is not well controlled. It is also well known that GaN crystals can be prepared by flowing $NH_3$ and $N_2$ over a Ga melt to increase dissolution of nitrogen in Ga at atmospheric pressure at 850° to 1000° C.

All of the more current growth methods from the liquid phase include the feature of nitrogen dissolution in the melt from a gaseous nitrogen source and the reaction of nitrogen and gallium. If complex flux of Ga and another component is used, the composition of the solution changes during the growth of GaN, because of GaN consuming, and this makes difficult to control crystal growth.

An important feature in gallium nitride and other Group III nitrides growth, generally, is control over the numerous variables, such as gas pressure, temperature, phase changes, and other phenomena involved in the reaction. Where some of these variables can be combined, excluded or minimized, a greater degree of control over the remainder may be exercised on order to predetermine certain characteristics of the final Group III nitride crystals. Control over the actual growth of a Group III nitride crystals permits growth of larger crystals or of obtaining crystals of various shapes and sizes. Such control can also provide means to predetermine crystal purity, structure perfection and semiconductor properties.

BRIEF SUMMARY OF THE INVENTION

It is an object of this invention to provide a low temperature and pressure process for making Group III nitride crystals comprising the steps of:

(a) charging a reaction vessel with a Group III nitride material source and a composition of lithium nitride and barium fluoride salt-based solvent in contact therewith;

(b) placing the charged reaction vessel into a chamber;

(c) subjecting simultaneously the reaction vessel and the charge therein both to pressure and temperature in the Group III nitride-stable region of the phase diagram of Group III nitride to prevent dissociation of Group III nitride;

(d) heating at a temperature in excess of the melting point of the solvent layer to render the solvent molten;

(e) avoiding the dissolution of nitrogen gas in a liquid, reaction of nitrogen with Group III element, and a change of the solution's composition during the growth of Group III nitride; and (f) dissolving Group III nitride first in a molten solvent in the hotter part of the reaction vessel, and then precipitated from the molten solution to grow a single crystal in a cooler part of the reaction vessel.

It is an object of this invention to provide improved control over Group III nitride, particularly gallium nitride, single crystal growth.

It is another object of this invention to prepare single crystal gallium nitride, and other Group III nitrides, at lower temperature and low pressure.

It is another object of this invention to use molten salt based solvent in a process characterized by a temperature gradient or a temperature difference.

It is another object of this invention to grow single crystal Group III nitride in a molten solvent that is free of Group III element.

It is another object of this invention to grow single crystal of gallium nitride and other Group III nitride in absence of nitrogen dissolution in order to react Group III element with nitrogen to grow the Group III nitride crystals.

It is another object of this invention to grow single crystal gallium nitride and other Group III nitride of a large size exceeding about one inch.

It is another object of this invention to grow single crystal gallium nitride at a growth rate exceeding prior art.

It is another object of this invention to grow commercial size and commercial grade single crystal gallium nitride, and other Group III nitrides, for use in electronic devices.

It is another object of this invention to grow single crystal gallium nitride, and other Group III nitrides, by a low temperature and low pressure process with a dislocation density in the crystals of fewer than about 1000 dislocations per square centimeter.

These and other objects of this invention can be accomplished by a process of growing gallium nitride single crystal, and other Group III nitrides, at nitrogen pressure and temperature in the region of the phase diagram where the Group III nitride is thermodynamically stable, which process includes using solid Group III nitride itself as a source for growing Group III nitride crystal, and using solvent for the Group III nitride. In such a way we eliminate the dissolution of gas nitrogen in a liquid, reaction of nitrogen with Group III element, and a change of the solution's composition during the growth of Group III nitride.

In practice this invention includes the steps of selecting components for a reaction vessel to provide a predetermined temperature gradient under operating conditions; assembling these components and enclosing a charge therein. This charge comprises (1) a source of Group III nitride located in a region of the reaction vessel, which under operating conditions will have a temperature at or near the high end of the temperature gradient, and (2) a layer of solvent interposed between the source of Group III nitride and the deposition site, the solvent being prepared from the lithium nitride ($Li_3N$) combined with barium fluoride ($BaF_2$), or lithium nitride combined with barium fluoride and lithium fluoride (LiF) composition, and (3) also may include at least one Group III nitride seed crystal located in deposition site (a region of the reaction vessel, which under operating conditions will have a temperature at or near the low end of the aforementioned temperature gradient); simultaneously subjecting the reaction vessel and the charge therein both to pressure and temperature in the Group III nitride-stable region of the phase diagram of Group III nitride and to heat at a temperature in excess of melting point of the solvent layer, whereby Group III nitride is first dissolved in a molten solvent in the hotter part of the reaction vessel, and then precipitated from the molten solution to grow a single crystal either self seeded or on a seed if one was included in a cooler part of the reaction vessel.

DETAILED DESCRIPTION OF THE INVENTION

Figure 1:
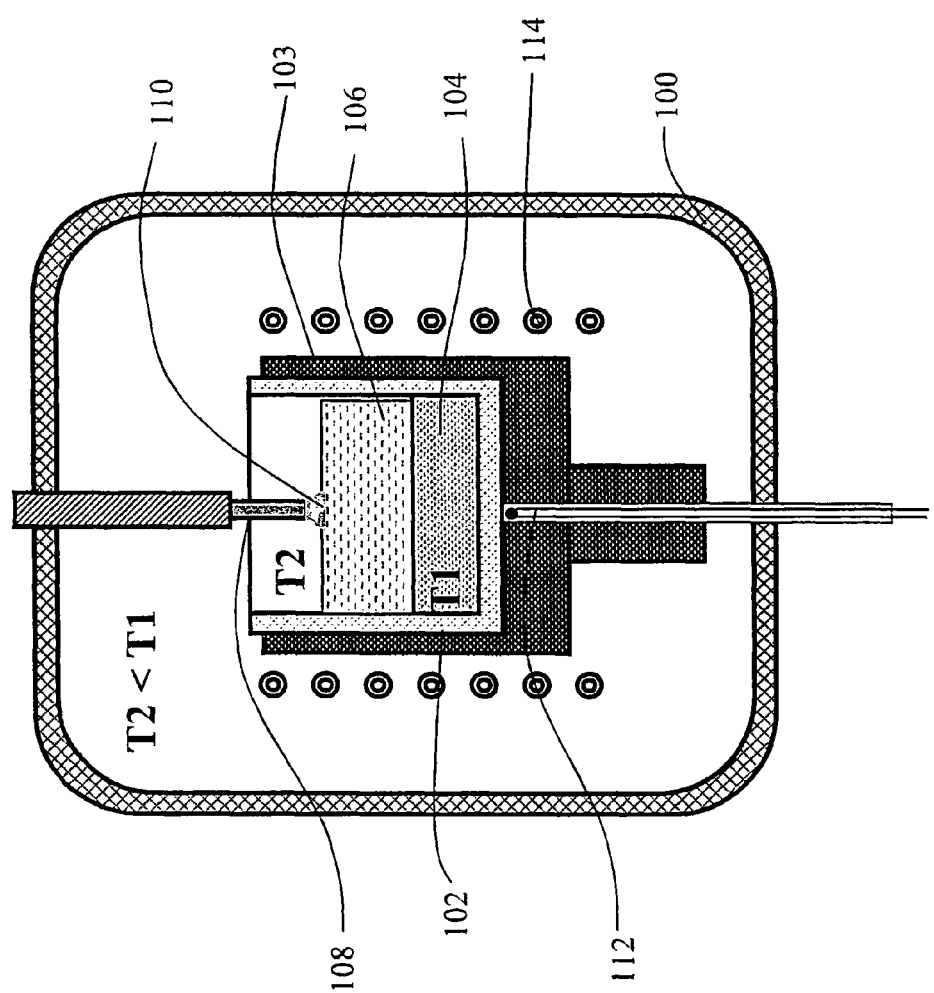
FIG. 1 shows reaction vessel and growth chamber where single crystal Group III nitride product is made under atmosphere comprising a nitrogen or ammonia containing gas.

While the detailed description may at some point describe the growth of gallium nitride in particular, it should be understood that the invention also applies to the growth of Group III nitrides.

This invention pertains to a process for growing single crystal Group III nitride which process is characterized by the use of a molten salt based solvent and the application of a temperature gradient to control dissolution of solid Group III nitride in the solvent and to precipitate the single crystal of Group III nitride. More specifically, the process for making single crystal of Group III nitride includes the steps of depositing Group III nitride source, depositing a salt based solvent, heating the solvent to render it molten and to provide a temperature gradient between the Group III nitride source and the growing single crystal nitride, and keeping the heat for a time to dissolve Group III nitride source, to transfer Group III nitride through the layer of the solvent, to create supersaturated solution of Group III nitride, and to precipitate Group III nitride as a single crystal; and discontinuing the heating step.

The process involves the use of lithium nitride together with barium fluoride in a molten state as a solvent to promote dissolution therein of solid Group III nitride. Lithium fluoride can be added to barium fluoride as a dilutant. Lithium nitride is an active part of the solvent, which provides the dissolution of the Group III nitride. But lithium nitride has melting point of 845° C. and creates binary nitrides with Group III nitrides with even higher melting points. It makes impossible to use pure lithium nitride as a solvent for GaN and other Group III nitrides without applying high pressure. It is known that lithium nitride creates low melting points eutectics with lithium halides (LiCl, LiI, LiBr). But vapor pressure of these salts is high even at eutectic melting points. Rapid evaporation of the salt component of the solvent, based on these eutectics, will change the composition of the solvent during the long growth run.

We discover that $BaF_2$, which has only $10^{-3}$ Pa vapor pressure at 915° C., is the sole fluoride among alkali and alkaline-earth halides which dissolves $Li_3N$ and resists complete breakdown when exposed to lithium nitride. Other halides exothermically react with $Li_3N$, and sometimes violently. We found that $BaF_2$ creates a compound with $Li_3N$ which melts at approximately 730° C. at 0.1 MPa nitrogen ($N_2$) pressure. Thus, only barium fluoride can be used with lithium nitride in a salt based solvent for Group III nitride growth from the solution. It was found also that LiF doesn't react with lithium nitride, doesn't dissolve $Li_3N$, and can be used as a dilutant for the $L_3N$ with $BaF_2$ based solvent.

Low melting point of the solvent gives an opportunity to grow Group III nitrides crystals at low pressure.

Temperature gradient inside the molten solvent between the Group III nitride source and the growing Group III nitride single crystal promotes dissolution of the Group III nitride source, creating supersaturated solution of Group III nitride in the solvent, and precipitation of the Group III nitride either on the coldest parts of the reaction vessel, containing the solvent and the source of Group III nitride or on one or more seed crystals disposed in a deposition zone.

Disclosure of the process here is made in connection with the equipment shown in FIG. 1 where growth chamber 100 is shown containing within furnace 103 with crucible 102 disposed thereon containing solid Group III nitride, in the case of gallium nitride usually polycrystalline or sintered gallium nitride as a source of gallium nitride, 104 at bottom thereof and molten solvent 106 disposed thereover. Optional holder 108 holding optional seed gallium nitride crystal 110 immersed in or in contact with solvent 106. For the case of Group III nitrides growth seed Group III crystal is used. Thermocouple 112 can measure temperature near the nitride source 104 and coils 114 can heat the crucible 102 to the desired temperature in order to liquefy the solvent. Operation of the equipment shown in FIG. 1 typically involves disposition of Group III nitride 104 and the solvent 106 in the crucible 102, liquefying the solvent 106, providing a temperature gradient whereby temperature of the solvent nearby Group III nitride source is higher than temperature of the molten solvent nearby the place where Group III nitride single crystal is growing, all under pressure of a gas, containing nitrogen or ammonia, in the chamber 100, precipitating single crystal Group III nitride and cooling the charge.

During the process of gallium nitride growth, the solvent is in a molten state at a temperature in the typical range of 700-900° C., more typically 750-850° C. and the nitrogen pressure in the growth chamber is typically above atmospheric, in the range of 1-100 atmospheres, and more typically 1-80 atmospheres. The temperature gradient, i.e., the temperature difference inside the solvent between the gallium nitride source and the growing crystal, is typically 1-100° C. across the thickness of the solvent, and more typically 5-50° C.

Figure 4B:
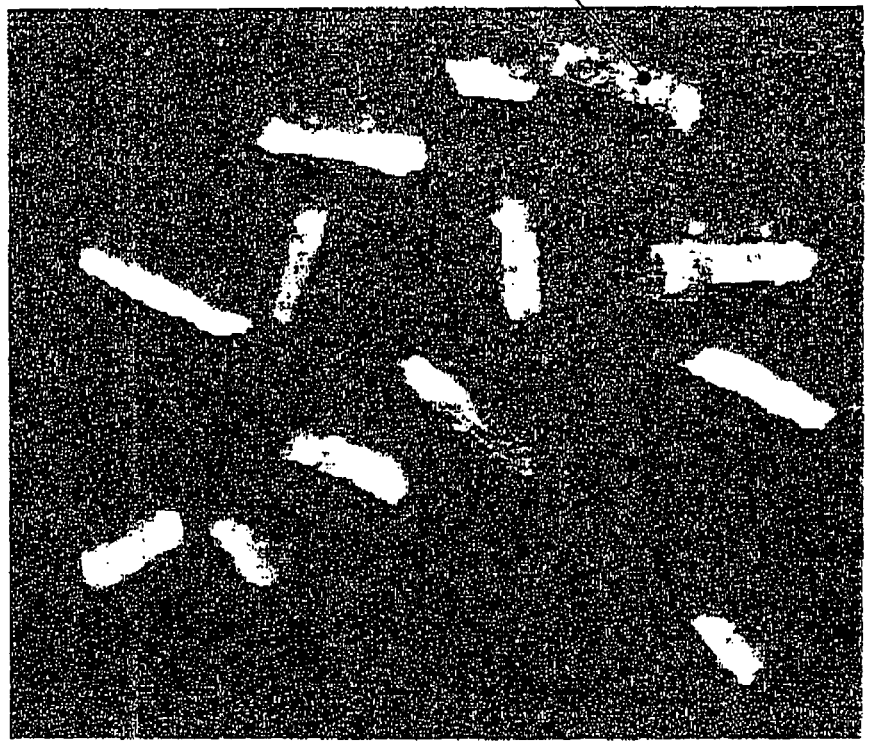
FIGS. 4(A) and (B) show rod-shaped single crystal gallium nitride product made by the low temperature and low pressure temperature gradient process disclosed herein.
Figure 4B:
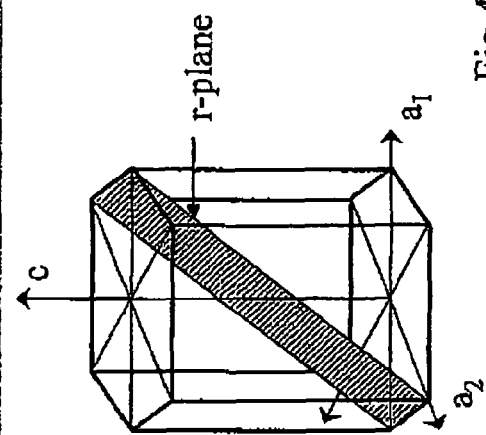

In an embodiment of this process with a seed crystal, the seed crystal is typically the coldest spot in the reactor when deposition of single crystal gallium nitride takes place. Due to the motive force imparted to the gallium nitride dissolved in the solvent, gallium nitride leaves the solvent when the solvent becomes supersaturated with gallium nitride and deposits on the seed crystal and the seed crystal grows with accretion of gallium nitride on its surface at a rate on the order of 500 microns per hour possibly in the r or the (1102) direction, as shown in FIG. 4B or in other crystallographic direction, but in excess of about 20 microns per hour. If the process is carried out without the seed crystal, then precipitation of gallium nitride will takes place on the colder parts of the crucible, i.e., reaction vessel containing the solvent and the gallium nitride. The resulting crystal typically has single crystal structure, but may be polycrystalline.

Having described the invention, the following example is given as a particular embodiment thereof and to demonstrate the practice and advantages thereof. It is understood that the example is given by way of illustration and is not intended to limit the specification of the claims in any manner.

EXAMPLE 1

This example demonstrates preparation of single crystal of gallium nitride at a low temperature and low pressure using a salt based solvent in the set-up shown in FIG. 1 where crucible 102 (about ¾ of an inch in diameter) contained sintered gallium nitride powder 104 with the salt based solvent 106 disposed thereover. All material preparations of the charge were carried out inside a glove box under a nitrogen atmosphere with moisture and oxygen content at under 1 ppm.

In carrying out the process, a layer of commercially available gallium nitride powder, which was preliminarily sintered and formed into a 1.2 g tablet of about ¼-inches in diameter and about ¼ inches thick, was placed at bottom of the crucible. The sintering procedure of the gallium nitride was at a pressure of 5-6 GPa and at a temperature of 1600-1700° C. for one hour. On top of the gallium nitride pill in the crucible was placed a composition of 1.0 g lithium nitride ($Li_3N$), 1.3 g of lithium fluoride (LiF) and 1.3 g of barium fluoride ($BaF_2$). Although lithium nitride melts at about 840° C., lithium fluoride melts at about 850° C. and barium fluoride melts at about 1370° C., the abovementioned composition of the three components melted at about 760° C. This solvent was in the form of a solid chunk of the three components.

After the crucible was filled with the gallium nitride and the solvent, the crucible was placed into chamber 100. Initially, the chamber was evacuated to a vacuum level of $10^{-3}$ Torr, filled with nitrogen of 99.9999% purity to a pressure of 1 MPa (about 10 atmospheres) and then evacuated to a vacuum level of $10^{-3}$ Torr once more. After the evacuation, the furnace was filled with nitrogen of 99.9999% purity to a pressure of 2.5 MPa (about 25 atmospheres). Then the crucible was heated by heating coils 114 whereby temperature of the lower end of the crucible was 800° C. and temperature at the higher end of the solvent was 770° C., resulting in a temperature difference of 30° C. inside the solvent in the crucible. During heating, the solvent melted and gallium nitride started to dissolve, saturating the solution, traveled through the solvent and precipitated on the interior colder parts of the crucible. These growth conditions of the process were maintained for one hour following which, the system was cooled to room temperature by turning off the heating coils and the nitrogen pressure was allowed to be reduced to atmospheric. The gallium nitride single crystals that had grown on the cold parts of the crucible were collected after dissolving the solvent in cold water.

Figure 2:
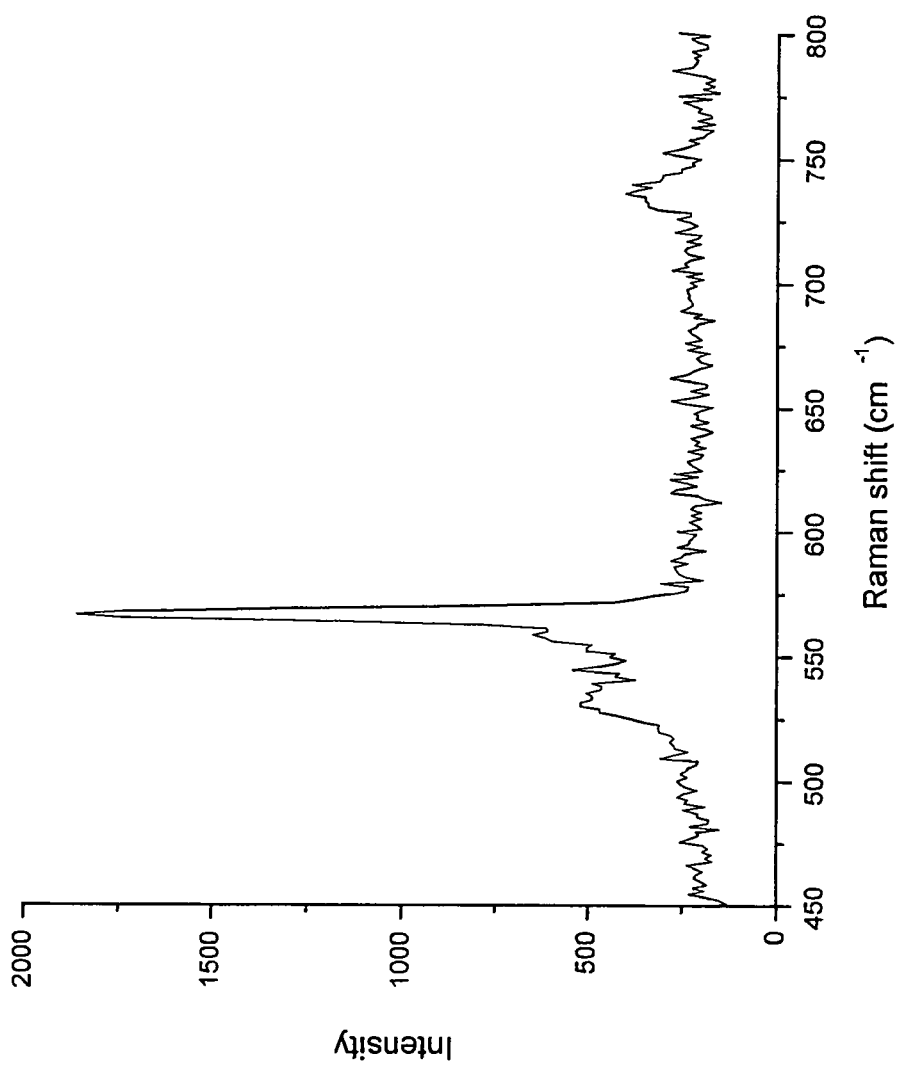
FIG. 2 shows the Raman spectrum of gallium nitride single crystal, which is of wurtzite type with good crystallinity.
Figure 3:
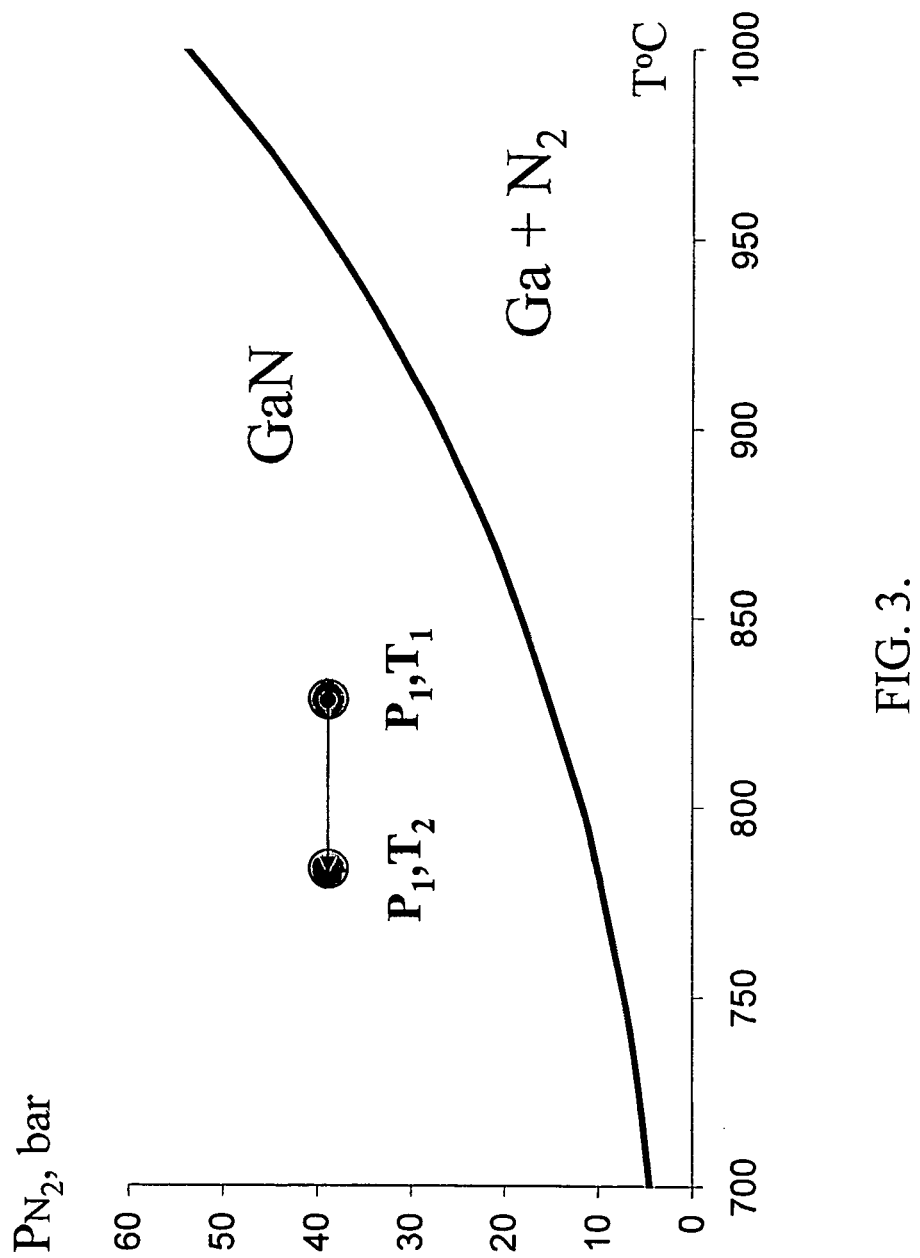
FIG. 3 illustrates thermodynamic equilibrium curve for single crystal gallium nitride wherein above the curve, the gallium nitride is stable and does not dissociate into gallium and nitrogen, as it does below the curve.

The gallium nitride crystals were about 0.5 mm long and 0.1 mm in diameter. The Raman spectrum of the crystals indicated that crystals were wurtzite type gallium nitride with good crystallinity, see FIG. 2. TEM measurements showed that the crystals to be single crystal gallium nitride with the growth axis in the r direction, see FIG. 4B. The parallelogram shape of the top of the crystal is also evident from FIGS. 4A and 4B. Traces of gallium in the solvent were not found by examination under an optical microscope. The rod shape of the crystals differed from the hexagonal platelet growth reported for the sodium flux, the lithium flux and the high temperature and high pressure prior art techniques. The growth rate was of 500 μm per hour.

EXAMPLE 2

This example demonstrates preparation of single crystal of boron nitride at a low temperature and low pressure. All material preparations of the charge were carried out inside a glove box under a nitrogen atmosphere with moisture and oxygen content at under 1 ppm.

Figure 5:
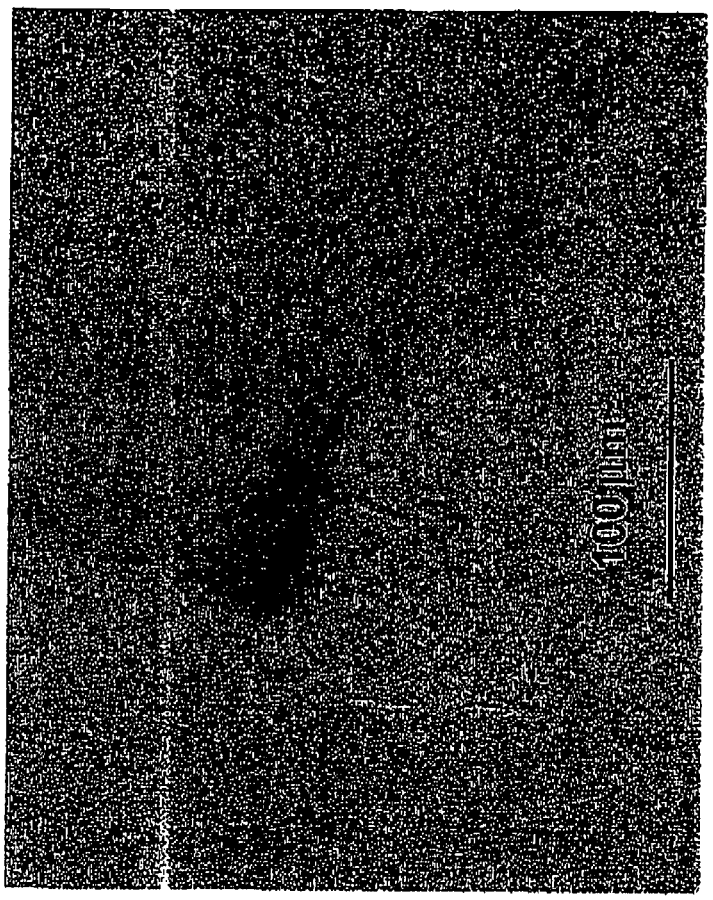
FIG. 5 shows optical micrograph of hexagonal boron nitride single crystal grown on PBN seed.
Figure 6:
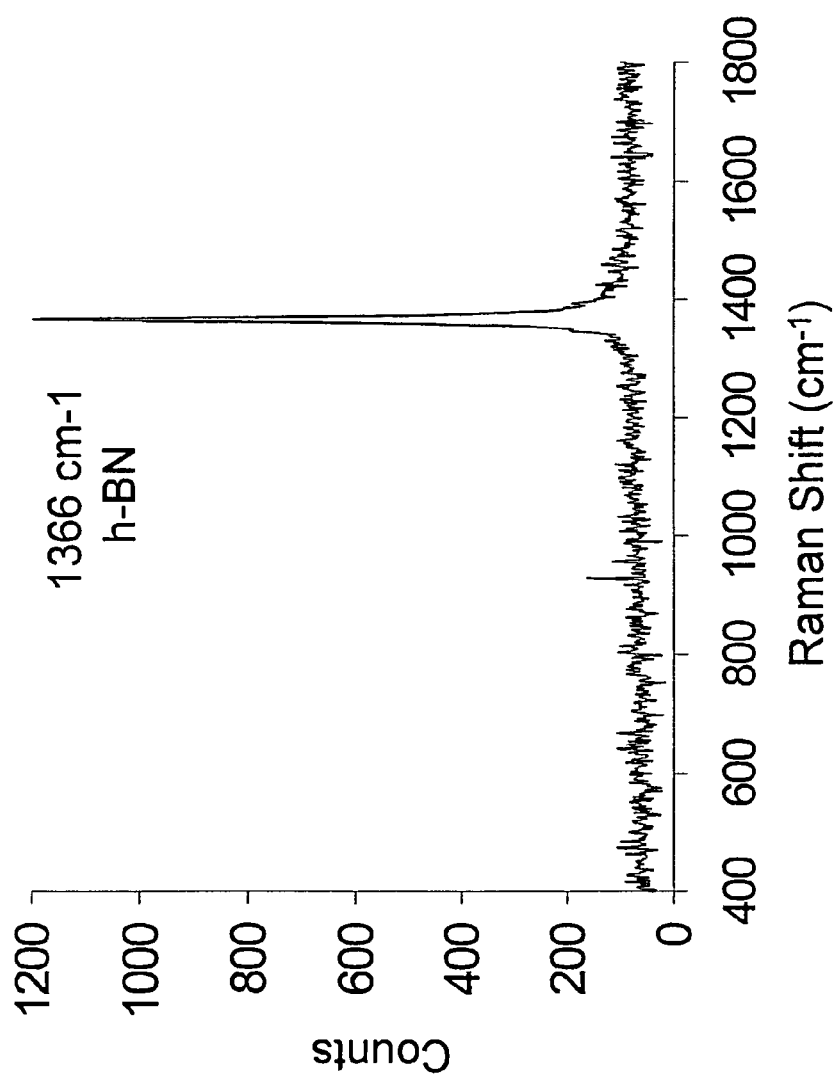
FIG. 6 shows Raman spectrum of a boron nitride single crystal. The line at 1366 $cm^{-1}$ corresponds to hexagonal boron nitride.

The solvent was prepared by adding solid $Li_3N$ (99.99%) to $BaF_2$ (99.999%). This fluoride/lithium nitride mixture was transferred to the reactor. Both the source and the seed were cut from large-area pyrolytic boron nitride (PBN) pieces. The PBN was sonicated in acetone and then methanol and cleaned by an acid etch prior to loading in the furnace. After loading, the furnace was pumped and purged with N2 (99.999%). The $BaF_2$—$Li_3N$—BN constituents were heated until a single liquid phase developed. The melting point of the solvent was determined by differential thermal analysis (DTA). After the solvent reaction was completed, the crucible position was changed with respect to the heater to induce a thermal gradient. The seed was dipped and kept at the growth temperature 850° C. and pressure 0.1 MPa for approximately 50 h, then it was withdrawn and the crucible was cooled. The crucible contents were washed in DI water and inspected for BN crystals. Optical microscopy (FIG. 5), Raman spectroscopy (FIG. 6) and transmission electron diffraction were used to characterize the BN crystals.

In another embodiment, this disclosure pertains to a process for making single crystal Group III nitride, particularly gallium nitride, at moderate pressure and temperature, in the region of the phase diagram of Group III nitride where Group III nitride is thermodynamically stable comprises a charge in the reaction vessel of (a) Group III nitride material as a source, (b) a barrier of solvent interposed between said source of Group III nitride and the deposition site, the solvent being prepared from the lithium nitride ($Li_3N$) combined with barium fluoride ($BaF_2$), or lithium nitride combined with barium fluoride and lithium fluoride (LiF) composition, and (c) also may include at least one Group III nitride seed crystal located in deposition site; heating the solvent to render it molten and to provide temperature gradient in the molten solvent such a way that said deposition site will be in the region of the reaction vessel, which under operating conditions will have a temperature at near the low end of the temperature gradient, and said source of GaN will be in the region of the reaction vessel, which under operating conditions will have a temperature at near the high end of the temperature gradient; dissolution of the source of GaN material in the molten solvent and following precipitation of GaN single crystals either self seeded or on the seed; maintaining conditions whereby the solvent is in a molten state with the Group III nitride dissolving in the molten solvent and then precipitating out of the solvent under impetus of the temperature gradient; and discontinuing the heating step.

While presently preferred embodiments have been shown of the novel process, and of the several modifications discussed, persons skilled in this art will readily appreciate that various additional changes and modifications may be made without departing from the spirit of the invention as defined and differentiated by the following claims.

What we claim is:

1. A low temperature and pressure process for making Group III nitride crystals comprising the steps of:
   (a) charging a reaction vessel with a Group III nitride material source and a predetermined compound composition of lithium nitride and barium fluoride in contact therewith;
   (b) placing the charged reaction vessel into a chamber;
   (c) subjecting simultaneously the reaction vessel and the charge therein both to pressure and temperature;
   (d) maintaining the stoichiometry of the Group III nitride source material;
   (e) heating a reaction vessel to a temperature of the melting point of the predetermined compound composition of lithium nitride and barium fluoride to render the predetermined compound composition molten and creating a liquid salt-based solvent at a temperature below the melting point of either lithium nitride or barium fluoride, wherein said heating step is conducted in an atmosphere comprising a nitrogen containing gas at a pressure on the order of 1-100 atmospheres and wherein said heating step is carried out to a liquefaction temperature of the salt-based solvent and wherein a temperature difference is 1-100° C. across the salt-based solvent thickness and wherein the predetermined compound composition of lithium nitride and barium fluoride creates liquid solvent at a temperature of 730° C. and a pressure of 0.1 MPa;
   (f) maintaining the composition of the molten Group III nitride source material together with the lithium nitride and barium fluoride salt-based solvent;
   (g) disposing a Group III nitride seed crystal to the salt-based solvent whereby Group III nitride from the Group III nitride source precipitates on the Group III nitride seed crystal; and
   (h) dissolving the Group III nitride source and maintaining the heat, to transfer Group III nitride through the layer of the salt-based solvent, to create a supersaturated solution of Group III nitride first in a molten solvent in the hotter part of the reaction vessel, and then precipitated from the molten solvent to grow a single crystal in a cooler part of the reaction vessel.

2. The process of claim 1 wherein lithium fluoride is added to the salt-based solvent as a dilutant and wherein the salt-based solvent is liquid at a temperature below 900° C.; the temperature difference is 5-50° C. across the salt-based solvent thickness; and accretion of Group III nitride from the Group III nitride source is in excess of 500 µm/hr.

3. The process of claim 2 wherein the Group III nitride source is polycrystalline nitride and the Group III nitride seed crystal is polycrystalline or single crystal Group III nitride and further involving the step of resulting in a Group III nitride crystal that is a wurtzite type rod shaped GaN with a length of at least 0.5 mm.

4. A low temperature and pressure process for making Group III nitride crystals comprising the steps of:
   (a) charging a reaction vessel with a Group III nitride material source and a predetermined compound composition of lithium nitride and barium fluoride in contact therewith;
   (b) placing the charged reaction vessel into a chamber;
   (c) applying a predetermined pressure to the charged reaction vessel to prevent dissociation of Group III nitride at a predetermined temperature and heating the charge in the reaction vessel to render the predetermined compound composition of lithium nitride and barium fluoride molten and creating a liquid salt-based solvent at a temperature below the melting point of either lithium nitride or barium fluoride and to provide a temperature difference in the molten solvent between the Group III nitride source and a growing single crystal Group III nitride in such a way that said growing single crystal nitride will be in the region of the reaction vessel which, under operating conditions, has a temperature near the low end of the temperature difference, and said Group III nitride source will be in the region of the reaction vessel which, under operating conditions, has a temperature near the high end of the temperature difference, wherein said heating step is conducted in an atmosphere comprising a nitrogen containing gas at a pressure on the order of 1-100 atmospheres and wherein said heating step is carried out to a liquefaction temperature of the salt-based solvent and wherein the temperature difference is 1-100° C. across the salt-based solvent thickness and
   wherein the predetermined compound composition of lithium nitride and barium fluoride creates liquid solvent at a temperature of 730° C. and a pressure of 0.1 MPa;
   (d) maintaining process conditions whereby the salt-based solvent is molten, with the nitride from the Group III nitride source dissolving in the salt-based solvent and precipitating out of the salt-based solvent under the impetus of the temperature difference; and
   (e) discontinuing said heating step.

5. The process of claim 4 further including the step of disposing a Group III nitride seed crystal to the salt-based solvent whereby Group III nitride from the Group III nitride source precipitates on the Group III nitride seed crystal.

6. The process of claim 5 wherein lithium fluoride is added to the salt-based solvent as a dilutant.

7. The process of claim 6 wherein the salt-based solvent is liquid at a temperature below 900° C.; the temperature difference is 5-50° C. across the salt-based solvent thickness;

and accretion of Group III nitride from the Group III nitride source is in excess of 10 µm/hr.

8. The process of claim 7 wherein the Group III nitride source is polycrystalline nitride and the Group III nitride seed crystal is polycrystalline or single crystal Group III nitride.

* * * * *